US011287461B2

(12) United States Patent
Emanuel et al.

(10) Patent No.: US 11,287,461 B2
(45) Date of Patent: Mar. 29, 2022

(54) TESTING AN ENERGY TRANSMISSION NETWORK AND LOCALIZING A FAULT LOCATION IN AN ENERGY TRANSMISSION CABLE

(71) Applicant: Omicron Energy Solutions GmbH, Berlin (DE)

(72) Inventors: Harald Emanuel, Berlin (DE); Andreas Cobet, Berlin (DE); David Kühling, Berlin (DE); Jan Möller, Berlin (DE)

(73) Assignee: Omicron Energy Solutions GmbH, Berlin (DE)

( * ) Notice: Subject to any disclaimer, the term of this patent is extended or adjusted under 35 U.S.C. 154(b) by 132 days.

(21) Appl. No.: 16/616,644

(22) PCT Filed: May 23, 2018

(86) PCT No.: PCT/EP2018/063556
§ 371 (c)(1),
(2) Date: Nov. 25, 2019

(87) PCT Pub. No.: WO2018/219750
PCT Pub. Date: Dec. 6, 2018

(65) Prior Publication Data
US 2020/0096551 A1 Mar. 26, 2020

(30) Foreign Application Priority Data
Jun. 2, 2017 (AT) .................................. A 466/2017

(51) Int. Cl.
*G01R 31/11* (2006.01)
*G01R 31/08* (2020.01)
(52) U.S. Cl.
CPC ............ *G01R 31/11* (2013.01); *G01R 31/085* (2013.01)

(58) Field of Classification Search
CPC .... G01R 31/11; G01R 31/085; G01R 31/088; G01R 31/083
See application file for complete search history.

(56) References Cited

U.S. PATENT DOCUMENTS 6,366,095 B1  4/2002  Van Aartrijk
7,698,582 B2*  4/2010  Qin .................... G01R 19/2513
                                                713/300
(Continued)

FOREIGN PATENT DOCUMENTS

CN       1251654      4/2000
CN       1777814      5/2006
(Continued)

OTHER PUBLICATIONS

Search Report, counterpart Japanese App. No. 2019-566737 with English translation (dated Dec. 23, 2020) (36 pages).
(Continued)

*Primary Examiner* — Tung X Nguyen
*Assistant Examiner* — Feba Pothen
(74) *Attorney, Agent, or Firm* — Cook Alex Ltd.

(57) ABSTRACT

A method includes detecting a first time, at which a specific partial discharge pulse is detected in an energy transmission cable at a first point at one cable end; detecting a second time, at which the pulse is detected in the cable at a second point at the other cable end; determining a fault location along the in accordance with the first and the second times; determining third and fourth points located in the cable, the third and fourth points delimiting a portion of the cable, including the fault location and none of the other points; detecting a third time, at which a further specific partial discharge pulse is detected in the cable at the third point; detecting a fourth time, at which the further pulse is detected
(Continued)

in the cable at the fourth point; correcting the determined fault location in accordance with the third and fourth times.

8 Claims, 2 Drawing Sheets

(56) References Cited

U.S. PATENT DOCUMENTS

| | | |
|---|---|---|
| 2005/0212526 A1 | 9/2005 | Blades |
| 2007/0057677 A1 | 3/2007 | Koch et al. |
| 2008/0059671 A1 | 3/2008 | Blumcke et al. |
| 2009/0289637 A1 | 11/2009 | Radtke |
| 2013/0121347 A1 | 5/2013 | Saito et al. |
| 2014/0074414 A1* | 3/2014 | Schweitzer, III ........ H02H 7/26 702/59 |
| 2017/0102426 A1 | 4/2017 | Schweitzer, III et al. |
| 2017/0117701 A1* | 4/2017 | Johannesson .......... H02H 7/265 |
| 2018/0307217 A1 | 10/2018 | Barsukov et al. |
| 2020/0209299 A1* | 7/2020 | Sri Gopala Krishna Murthi ........ H04L 12/40 |

FOREIGN PATENT DOCUMENTS

| | | |
|---|---|---|
| CN | 101382577 | 3/2009 |
| CN | 104 049 179 | 9/2014 |
| DE | 19935867 | 2/2001 |
| DE | 102014222662 | 5/2016 |
| JP | S60-169775 | 9/1985 |
| JP | H01-184474 | 7/1989 |
| JP | H04-320977 | 11/1992 |
| JP | H06-102308 | 4/1994 |
| JP | H08-62277 | 3/1996 |
| JP | H11-215688 | 8/1999 |
| JP | 2000-258487 | 9/2000 |
| JP | 2003-084027 | 3/2003 |
| JP | 2008-141866 | 6/2008 |
| JP | 2013-106329 | 5/2013 |
| WO | WO2013/113627 | 8/2013 |

OTHER PUBLICATIONS

Notification of Reasons for Rejection, counterpart Japanese App. No. 2019-566737, with English translation (dated Dec. 22, 2020) (21 pages).

Office Action and Search Report (with partial English translation), counterpart Chinese application No. 201880036651 (dated Jun. 15, 2021) (12 pages).

International Search Report, counterpart International Appl. No. PCT/EP2018/063556 (dated Nov. 23, 2018) (7 pages, with 4 pages of translation).

International Written Opinion Report, counterpart International Appl. No. PCT/EP2018/063556, (dated Jul. 12, 2018) (10 pages, without translation).

Barburas et al., Detecting the Fault Location Using Traveling Wave, 6$^{th}$ Int'l Conf. on Modern Power Systems MPS2015, pp. 23-26 (May 18, 2015).

Kumm et al., A new approach of synchronous PD measurement at both ends of a H.V. gas pressure cable system, Proceedings of the XIVth Int'l Symposium on High Voltage Engineering (Aug. 25, 2005) (6 pages).

Notification of Reasons for Rejection with English translation, counterpart Japanese App. No. 2019-566737 (dated Oct. 5, 2021) (15 pages).

* cited by examiner

TESTING AN ENERGY TRANSMISSION NETWORK AND LOCALIZING A FAULT LOCATION IN AN ENERGY TRANSMISSION CABLE

The present application is a U.S. National Stage of PCT International Patent Application No. PCT/EP2018/063556, filed May 23, 2018, which claims priority to Austrian Application No. A50466/2017, filed Jun. 2, 2017, both of which are hereby incorporated herein by reference.

TECHNICAL FIELD

The present invention relates firstly to testing a power transmission network for faults (for example for faults in the insulation) and secondly to localizing a fault of this kind by way of a fault location in a power transmission cable being localized.

BACKGROUND

In accordance with the prior art, an event (for example the effects of a partial discharge) is detected only at one measurement point of the power transmission network for testing a power transmission network and, in particular, for localizing a fault location. Since the time at which this event occurs at the measurement point and a further time at which a reflection of this event occurs at the measurement point are determined, the fault location can then be localized.

However, this known localization of the fault location in a power transmission network or, more precisely, in a power transmission cable of the power transmission network is quite inaccurate. Therefore, the object of the present invention is to improve the localization of a fault location in a power transmission cable in comparison to the prior art. Since the solution to this problem is based on determining as accurately as possible a time at which a specific event occurs at a specific measurement point of the power transmission network, the object according to the invention additionally comprises determining said time as accurately as possible.

SUMMARY

According to the invention, this object is achieved by a method for localizing a fault location as claimed in claim 1, by a method for testing a power transmission network as claimed in claim 5, and also by a system as claimed in claim 8 or 10. The dependent claims describe advantageous and preferred embodiments of the present invention.

The present invention provides a method for localizing a fault location in a power transmission cable, wherein the method according to the invention comprises the following steps:

Detecting a first time at which a specific partial discharge pulse, which is produced at the fault location, is detected in the power transmission cable at a first measurement point which is arranged at one end of the power transmission cable. Accordingly, the first time defines when the effects of a specific partial discharge, which is produced at the fault location, have propagated to the first measurement point via the power transmission cable. The propagation of the effects of the partial discharge in this case comprises, in particular, charge damping and requires time in order to propagate along the power transmission cable.

Detecting a second time at which the specific partial discharge pulse is detected in the power transmission cable at a second measurement point which is arranged at the other end of the power transmission cable. In the same way as the first time, the second time defines when the effects of the specific partial discharge pulse or the specific partial discharge have propagated to the second measurement point via the power transmission cable.

Determining the fault location along the power transmission cable, at which fault location the specific partial discharge pulse or the specific partial discharge was generated, depending on the first and the second time. As will be explained in even more detail later, the fault location can be quite accurately determined as the distance from the first measurement point or second measurement point, in particular with knowledge of the length of the power transmission cable and the propagation speed of the partial discharge pulse on the power transmission cable.

Determining a third and a fourth measurement point from a quantity of measurement points which are arranged in the or along the power transmission cable. In this case, the third and the fourth measurement point are determined in such a way that they delimit a section of the power transmission cable, in which section the fault location, the position of which was determined in the previous step, is situated and no further measurement points are located. In this step, two measurement points from the quantity of measurement points, between which two measurement points the fault location is situated and which are at the smallest possible distance from the fault location from amongst all of the measurement points, are accordingly determined using the third and fourth measurement point.

Detecting a third time at which a further specific partial discharge pulse is detected in the power transmission cable at the third measurement point.

Detecting a fourth time at which the further specific partial discharge pulse is detected at the fourth measurement point. These two last steps are very similar to the two first steps of the method according to the invention, only differing in that, in the last steps, the measurement points (that is to say the third and the fourth measurement point) are arranged closer to the fault location than in the two first steps of the method according to the invention.

Correcting the determined fault location depending on the third and the fourth time. The position of the fault location can be determined more effectively on the basis of the third and the fourth time than on the basis of the first and the second time since the third and the fourth measurement point are located closer to the fault location than the first and the second measurement point. In this case, correction of the determined fault location is understood to mean, in particular, that the position of the determined fault location is determined more accurately.

Since, according to the invention, the determination of the position of the fault location or the localization of the fault location is performed on the basis of two measurement points which are arranged respectively to the right and to the left of the fault location in the power transmission cable in the drawings, the localization of the fault location can be performed substantially more accurately than according to the prior art in which only one measurement point and the reflection of the partial discharge pulse are used. Furthermore, the localization of the fault location is advantageously performed in two stages as it were. In a first stage, the fault location is roughly localized in order to select two measurement points (that is to say the third and the fourth measurement point) in an optimum manner (that is to say as close as possible to the fault location) on the basis of this rough localization. The position of the fault location can then advantageously be determined in a highly accurate manner in the second stage on the basis of said two optimally selected measurement points.

In this case, a measurement point is understood to mean, in particular, a cable connection (joint) or a cable terminal (termination).

In this case, the detection and, respectively, measurement of the partial discharge at a specific measurement point are performed, in particular, in a static manner. In this case, the detection and, respectively, measurement are performed repeatedly on the basis of a large number of events (partial discharges) in order to avoid faults in the correlation.

The detection of a time at which a specific partial discharge pulse is detected in the power transmission cable at a specific measurement point requires the ability to distinguish between the specific partial discharge pulse and another partial discharge pulse at the specific measurement point. In other words, the present invention requires the effects of the same partial discharge at the fault location to be detected at the first (third) and second (fourth) measurement point in order to be able to localize the site of the fault location on the basis of the times.

The drawing of a distinction between partial discharge pulses can be performed, for example, on the basis of properties of the partial discharge pulses to be compared. For example, the partial discharge pulse which is detected respectively at the specific measurement point can be analyzed depending on a power pulse which is transmitted on the power transmission cable and on the basis of a time at which the partial discharge pulse has, for example, specific properties, in order to be able to distinguish the specific partial discharge pulse from other partial discharge pulses. This procedure for detecting a time at which a specific partial discharge pulse is detected in the power transmission cable at a specific measurement point is known according to the prior art and therefore is not discussed in any further detail here.

According to a preferred embodiment according to the invention, the fault location is determined as a distance $l_f$ from the third measurement point using the following equation (1):

$$l_f = \frac{v_{PD}}{2}(t_3 - t_4) + \frac{l}{2} \quad (1)$$

Here, $t_3$ corresponds to the third time, $t_4$ corresponds to the fourth time, $v_{PD}$ corresponds to the propagation speed of the partial discharge pulse (that is to say the effects of the partial discharge) along the power transmission cable, and $l$ corresponds to the length of the section of the power transmission cable which is delimited by the third and fourth measurement point.

It should be noted that the equation (1) can also be used in order to determine the fault location depending on the first and the second time. In this case, $t_3$ corresponds to the first time, $t_4$ corresponds to the second time, and $l$ corresponds to the length of the power transmission cable which runs from the first measurement point or one end to the second measurement point or the other end of the power transmission cable. In this case, the distance $l_f$ defines the distance of the fault location from the first measurement point or one end of the power transmission cable.

Furthermore, it is possible according to the invention for in each case the same partial discharge pulse or the effects of the same partial discharge, even if with different damping, to be detected at the first, second, third and fourth time at the first, second, third and, respectively, fourth measurement point. In this case, the specific partial discharge pulse corresponds accordingly to the further specific partial discharge pulse.

For example, all measurement points can be designed such that they each determine and store the times at which they detect partial discharge pulses. In a subsequent evaluation step, it is then possible to determine for the same partial discharge pulse when said partial discharge pulse was detected at the first, second, third and fourth measurement point, it then being possible to ascertain the position of the fault location from this information, as is described above.

According to a further preferred embodiment according to the invention, the first, the second, the third and the fourth time each correspond to a corresponding time at which an item of information about the respective partial discharge pulse is detected by a control device or control means. According to the further embodiment, a respective time delay which is produced by the transmission of the respective item of information from the corresponding measurement point to the control means is also determined. The respective time is then corrected by the corresponding time delay.

According to this further embodiment, a first, second, third and fourth measurement unit, which is connected to the first, second, third and, respectively, fourth measurement point, transmits the corresponding item of information via the corresponding partial discharge pulse to the control means as soon as the respective measurement unit has detected the corresponding partial discharge pulse at the associated measurement point. The control means then determine and correct the position of the fault location depending on the first, second, third and fourth time at which the respective item of information reaches the control means, wherein in this case the respective time delay, which is produced by the transmission of the respective item of information from the corresponding measurement point or from the corresponding measurement unit to the control means, is taken into account.

The way in which the respective time delay for the transmission of the respective item of information from the corresponding measurement unit to the control means is determined will be outlined in more detail below.

The present invention also provides a method for testing a power transmission network. In this case, the method for testing the power transmission network comprises the following steps:

Detecting an event (for example a partial discharge pulse or the effects of a partial discharge) at a measurement point or a measurement unit which is connected to the measurement point.

Transmitting an item of information about the event from the measurement point to control means. As soon as, in particular, the measurement unit which is connected to the measurement point detects the event, a corresponding item of information is transmitted to the control means.

Detecting a time at which the item of information about the event is detected by the control means. The time therefore defines when the item of information about the event reaches the control means.

Determining a time delay which is produced by a transmission of the item of information from the measurement point or the measurement unit which is connected to the measurement point to the control means.

Correcting the time depending on the determined time delay. Owing to the correction of the time by the time delay, the time advantageously accurately reflects the time at which the event was detected at the respective measurement point.

Testing the power transmission network depending on the event and the corrected time.

Since the corrected time virtually corresponds to the time at which the event to be detected was detected at the respective measurement point, the testing of the power transmission network can advantageously be executed based on this time. As a result, in particular, tests of the power transmission network can be carried out more accurately, in the case of which the respective time at which an event occurs at several different measurement points plays a role. Specifically when several measurement points are at different distances from the control means, the transmission time from the respective measurement points or measurement units which are connected to the respective measurement points plays a role in order to determine the time difference between the times at which the same event or the effects of the same event occurred at the respective measurement points. By way of taking into account the time delay according to the invention, the times at which the same event or the effects of the same event occurred at the respective measurement points can be defined more accurately than in the case of the prior art, as a result of which the testing of the power transmission network based thereon can likewise be executed more accurately.

According to a preferred embodiment according to the invention of the method for testing the power transmission network, the item of information about the event is transmitted from the measurement point (or from the measurement unit which is connected to the measurement point), via at least one further measurement point (or via at least one further measurement unit which is connected to a measurement point), to the control means. In this case, the measurement point (or the measurement unit), the at least one further measurement point (or the at least one further measurement unit) and the control means are connected to one another via lines via which the item of information is transmitted. In this embodiment, determining the time delay firstly comprises determining a run time of the item of information across the lines and secondly determining a processing time of the respective measurement point (or the respective measurement unit which is connected to the measurement point) in order to detect the item of information at the respective measurement point (measurement unit) and to pass on said item of information.

In this embodiment, the measurement points or measurement units are connected to one another, for example, by means of the daisy chain technique.

In this case, an item of information is passed on from the emitting measurement unit to the measurement unit which is next in the direction of the control means and then, for its part, passes on the item of information to the measurement unit which is next in the direction of the control means, etc. until the item of information finally reaches the control means.

When the measurement point (measurement unit) at which the event is detected, the at least one further measurement point (measurement unit) and the control means are each considered to be a unit, which units are connected in the daisy chain technique via the lines, the time delay $\Delta t$ can be calculated using the following equation (2)

$$\Delta t = \sum_{i=0}^{x} \frac{(RXBW_i - RXFW_i)}{2} - \frac{(TXBW_{i+1} - TXFW_{i+1})}{2} \qquad (2)$$

Here, $RXBW_j$ corresponds to the time at which a specific data packet is received at the j-th unit in a backward direction. $RXFW_j$ corresponds to the time at which the specific data packet is received at the j-th unit in a forward direction. $TXBW_j$ corresponds to the time at which the specific data packet is sent to the j-th unit in the backward direction. $TXFW_j$ corresponds to the time at which the specific data packet is sent to the j-th unit in the forward direction. x corresponds to the number of further measurement points (measurement units) which are situated between the control means and the measurement point (measurement unit) at which the event was detected. The control means ($E_0$) correspond to the 0-th unit, and the measurement point corresponds to the 'x+1'-th unit ($E_1$-$E_6$).

It should be noted that the method according to the invention for localizing a fault location can be combined with the method according to the invention for testing a power transmission network. Since, in particular, with detection of the first, second, third or fourth time, the time delay which is produced by the transmission of the item of information about the corresponding partial discharge pulse from the respective measurement point to the control means is taken into account, the detection or determination of the respective time at which the partial discharge pulse was detected at the corresponding measurement point can be carried out substantially more accurately.

The present invention also provides a system for localizing a fault location in a power transmission cable. In this case, the system according to the invention comprises control means and a plurality of measurement units. A first of these measurement units is connected to a first measurement point which is arranged at one end of the power transmission cable, while a second of these measurement units is connected to a second measurement point which is arranged at the other end of the power transmission cable. Each measurement unit is configured in order to detect in each case one partial discharge pulse at that measurement point which is connected to the respective measurement unit in the power transmission cable. The system is configured in order to detect a first time at which a specific partial discharge pulse is detected at the first measurement point by the first measurement unit by means of the first measurement unit, and in order to detect a second time at which the specific partial discharge pulse is detected at the second measurement point by the second measurement unit by means of the second measurement unit. The system is furthermore configured in order to determine a fault location along the power transmission cable, at which fault location the specific partial discharge pulse was produced, by means of the control means depending on the first and the second time. The system then determines a third measurement point and a fourth measurement point, by means of the control means, in such a way that the third and the fourth measurement point delimit a section of the power transmission cable in which the fault location is situated and no further measurement point which is connected to one of the measurement units is located. The system detects a third time at which a further specific partial discharge pulse is detected at the third measurement point by the third measurement unit by way of a third measurement unit which is connected to the third measurement point, and the system detects a fourth time at which the further specific partial discharge pulse is detected at the fourth measurement point by the fourth measurement unit by way of a fourth measurement unit which is connected to the fourth measurement point. Finally, the system corrects the determined fault location by means of the control means depending on the third and the fourth time.

The advantages of the system according to the invention substantially correspond to the advantages of the method according to the invention for localizing a fault location which are outlined in detail above, and therefore said advantages are not repeated here.

Finally, the present invention provides a system for testing a power transmission network, which system likewise comprises control means and a plurality of measurement units. In this case, each of these measurement units is connected to a respective measurement point within the power transmission network. Each measurement unit is configured in order to detect an event at the respective measurement point and in order to pass on an item of information about this event to the control means. The control means are configured in order to detect the item of information from the measurement units and in order to detect a time at which the item of information about the event is detected by the control means. The system is configured to determine a time delay which is produced by a transmission of the item of information from the measurement unit, which detects the event, to the control means. The control means are further configured in order to correct the time by the time delay, so that the corrected time reflects when the event was detected at the respective measurement point. Finally, the system is configured in order to test the power transmission network depending on the event and the corrected time.

The advantages of the system according to the invention for testing the power transmission network substantially correspond to the advantages of the method according to the invention for testing the power transmission network which are outlined in detail above, and therefore said advantages are not repeated here.

In a similar way to the two methods according to the invention, the two systems according to the invention can be combined. As a result, the respective time at which a specific partial discharge pulse is detected by the respective measurement unit at the associated measurement point can be determined depending on the time delay which is produced by the transmission of the item of information about the detected partial discharge pulse from the respective measurement unit to the control means.

A partial discharge in a high-voltage cable can advantageously be localized with an accuracy of 2 m by the present invention.

BRIEF DESCRIPTION OF THE DRAWINGS

The present invention will be described in detail below using preferred embodiments according to the invention with reference to the figures.

DETAILED DESCRIPTION OF THE EMBODIMENTS

Figure 1:
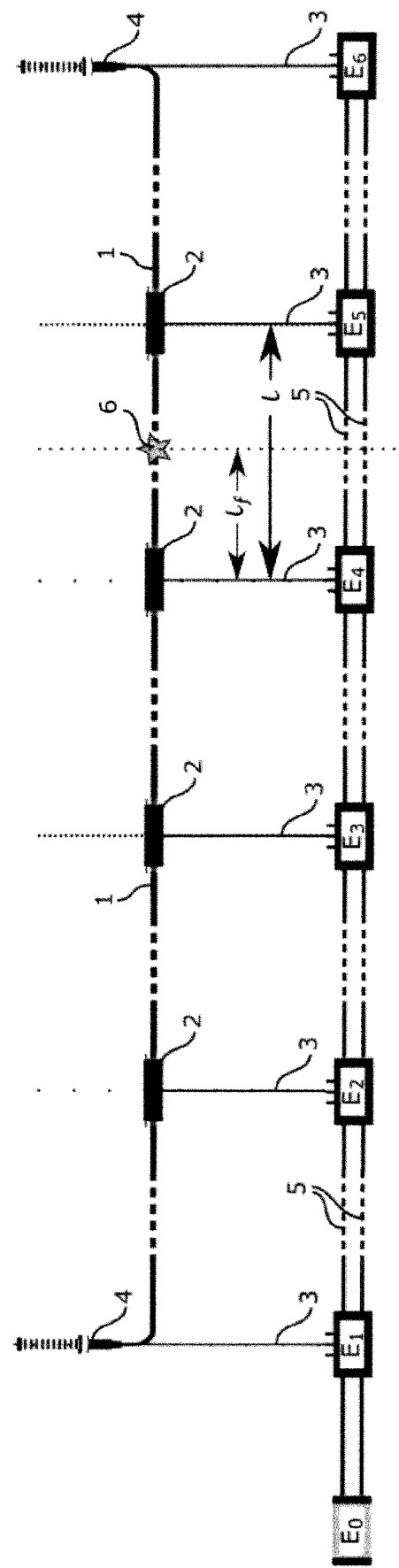
FIG. 1 illustrates a high-voltage cable with measurement points which are each connected to measurement units which, for their part, are connected to a control device or control means.

FIG. 1 illustrates a high-voltage cable 1 which is terminated at each of its two ends by a cable terminal 4. Connection pieces 2 by way of which the high-voltage cable 1 is subdivided into different sections are arranged at different points along the high-voltage cable 1. Each of said connecting pieces 2 and each of the two cable terminals 4 is connected to a measurement unit $E_1$-$E_6$ via a measurement cable. It should be noted that considerably more than six measurement units can also be used according to the invention.

The measurement units $E_1$ to $E_6$ are, in turn, connected to one another via fiber optic cables 5 in the daisy chain technique (for example up to 20 km), wherein the measurement unit $E_1$, for its part, is likewise connected to a controller $E_0$ via a fiber optic cable.

A fault location 6, at which partial discharge pulses are produced, is located between the fourth measurement unit $E_4$ and the fifth measurement unit $E_5$. That is to say, partial discharges take place at the fault location 6 in the high-voltage cable 1, it being possible to detect the effects of said partial discharges in the form of partial discharge pulses, which propagate along the high-voltage cable 1, at the measurement units $E_1$ to $E_6$. The distance between two measurement points which are adjacent along the high-voltage cable 1 and which are realized by a connecting piece 2 or by a cable terminal 4, is known in each case. The distance l between the fourth measurement point and the fifth measurement point is indicated in FIG. 1 by way of example. The object of the method according to the invention for localizing a fault location 6 is to determine as accurately as possible the distance $l_f$ between one measurement point 2; 4 and the fault location 6.

In order to achieve this object and, respectively, to localize the fault location 6, a first time at which a specific partial discharge pulse, which is produced at the fault location 6, is detected at one end of the high-voltage cable 1 (at the first measurement point 4), which is connected to the first measurement unit $E_1$, is determined in a first step of a first stage. A second time at which the specific partial discharge pulse is detected at the other end of the high-voltage cable 1 (at the sixth measurement point 4), which is connected to the sixth measurement unit $E_6$, is determined in a similar way in a second step of the first stage. With knowledge of the length of the high-voltage cable 1 (that is to say the distance between the first and the sixth measurement point) and the propagation speed of the partial discharge pulse along the high-voltage cable 1, the distance between the first measurement point and the fault location 6, for example, can be determined quite accurately using the above-described equation (1).

The position of the fault location 6 within the high-voltage cable 1 is known on the basis of the distance determined in this way. The two measurement points along the high-voltage cable 1 which are situated closest to the fault location 6 can now be determined on the basis of the position. The two measurement points which are determined in this way (fourth and fifth measurement point in FIG. 1), delimit a section of the high-voltage cable 1 in which firstly the fault location 6 is situated and in which secondly no single further measurement point 2 is situated. The localization of the fault location 6 is repeated in the same way with these two measurement points determined in this way, as described above.

In addition, a third time at which a specific partial discharge pulse, which originates at the fault location 6, is detected at one specific measurement point by the fourth measurement unit $E_4$, which is connected to this specific measurement point, is determined in a first step of a second stage. A fourth time at which the specific partial discharge pulse is detected at the other specific measurement point by the fifth measurement unit $E_5$, which is connected to the other specific measurement point, is determined in a second step of the second stage. Once again, the distance $I_f$ between the fourth measurement point and the fault location 6 can now be determined in a highly accurate manner using the equation (1) with knowledge of the distance I between the fourth and the fifth measurement point.

According to the invention, there are several options for ascertaining the time at which the specific partial discharge pulse is detected at a specific measurement point. Firstly, the measurement unit, which detects the partial discharge pulse at the measurement point which is connected to it, can determine the time, and this would be possible on the basis of very accurate timers in the measurement units. Another option is that the measurement unit, which detects the partial discharge pulse at the measurement point which is connected to it, transmits an appropriate item of information, indicating that the measurement unit has detected the partial discharge pulse, to the controller $E_0$, which then determines the time. However, in the case of this second option, it is advantageous to take into account the time delay which is required owing to the transmission of the appropriate item of information from the emitting measurement unit to the controller $E_0$. Specifically when the measurement units $E_1$ to $E_6$ are connected using the daisy chain technique, as is illustrated in FIG. 1 (and also in FIG. 2), this time delay should be taken into account since this time delay is influenced not only by the run time along the fiber optic cable 5, but rather also by the processing time of the measurement units which are situated between the emitting measurement unit and the controller $E_0$.

Figure 2:
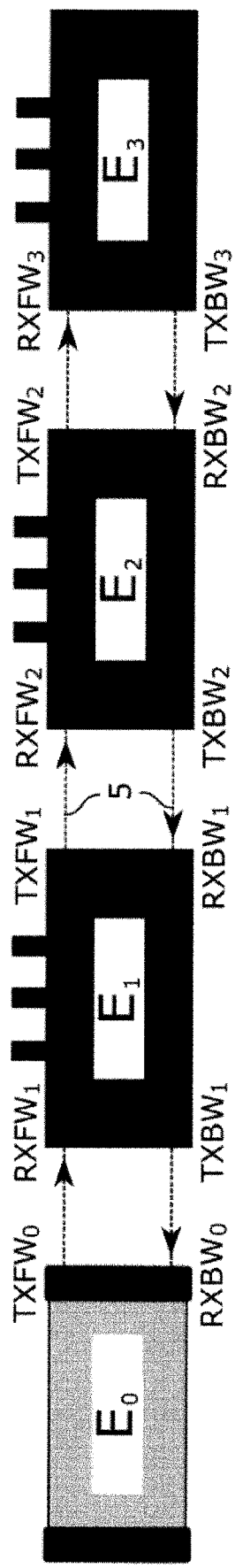
FIG. 2 illustrates, in detail, the connection according to the invention of three measurement units to the control means.

The manner in which the controller $E_0$ and the measurement units are connected to one another in the daisy chain technique is illustrated in principle and in more detail in FIG. 2 than in FIG. 1. Only three measurement units $E_1$ to $E_3$ (instead of the six measurement units $E_1$ to $E_6$ of FIG. 1) are illustrated in said FIG. 2 for reasons of illustration.

A data packet which is emitted by the controller $E_0$ is sent to the first measurement unit $E_1$ at the time $TXFW_0$ and received by the first measurement unit $E_1$ at the time $RXFW_1$ and further sent to the second measurement unit $E_2$ at the time $TXFW_1$, etc. On the return path, the data packet is sent by the third measurement unit $E_3$ to the second measurement unit $E_2$ at the time $TXBW_3$, which second measurement unit receives the data packet at the time $RXBW_2$ and further sends said data packet to the first measurement unit $E_1$ at the time $TXBW_2$, etc.

According to the above-described equation (2), the delay times $\Delta t_{VZ\,i,\,i+1}$ are, as it were, summed on the way from the measurement unit, which has detected the partial discharge pulse at its measurement point, to the controller $E_0$. In this case, each delay time $\Delta t_{VZ\,i,\,i+1}$ describes the time period which is required to transmit the item of information from the measurement unit i to the adjacent measurement unit i+1 (or in the opposite direction from the measurement unit i+1 to the adjacent measurement unit i). In this case, the delay time $\Delta t_{VZ\,i,\,i+1}$ can be determined in accordance with the following equation (3).

$$\Delta t_{VZ_{i,i+1}} = \frac{(RXBW_i - RXFW_i)}{2} - \frac{(TXBW_{i+1} - TXFW_{i+1})}{2} \qquad (3)$$

The time at which the controller $E_0$ detects the item of information that the partial discharge pulse was detected by the respective measurement unit is then corrected on the basis of the time delay $\Delta t$ which was calculated by the equation (2). That is to say, the corrected time is calculated on the basis of the difference between the time detected at the controller $E_0$ and the time delay $\Delta t$. By way of taking into account the respective time delay, the times at which the respective partial discharge pulse at the first measurement point (measurement unit $E_1$) and at the sixth measurement point (measurement unit $E_6$) and also at the fourth measurement point (measurement unit $E_4$) and the fifth measurement point (measurement unit $E_5$) (see FIG. 1) is detected can be determined in a highly accurate manner, as a result of which the distance $I_f$ of the fault location from the fourth measurement point (measurement unit $E_4$) can be determined with a very high degree of accuracy.

LIST OF REFERENCE SYMBOLS

1 High-voltage cable
2 Connecting piece
3 Measurement cable
4 Cable terminal
5 Fiber optic cable
6 Fault location
$E_0$ Unit or controller
$E_1$-$E_6$ Unit or measurement unit
I Length of a section of the high-voltage cable
$I_f$ Distance between measurement point and fault location
$RXBW_y$ Receiver in the backward direction ("Receiver Backward") in unit y
$RXFW_y$ Receiver in the forward direction ("Receiver Forward") in unit y
$TXBW_y$ Transmitter in the backward direction ("Transmitter Backward") in unit y
$TXFW_y$ Transmitter in the forward direction ("Transmitter Forward") in unit y

The invention claimed is:

1. A method for testing a power transmission network, which method comprises the following steps:
   detecting an event at a measurement point,
   transmitting an item of information about the event from the measurement point to a control device,
   detecting a time at which the item of information about the event is detected by the control device,
   determining a time delay which is produced by the transmission of the item of information from the measurement point to the control device,
   correcting the time by the time delay, and
   testing the power transmission network depending on the event and the corrected time,
   wherein the item of information about the event is transmitted from the measurement point, via at least one further measurement point, to the control device,
   wherein the measurement point, the at least one further measurement point and the control device are connected to one another via lines via which the item of information is transmitted, and
   wherein determining the time delay comprises determining a run time of the lines and a processing time of the at least one measurement point in order to detect the item of information at the respective measurement point and to pass on said item of information.

2. The method as claimed in claim 1, wherein the measurement point, the at least one further measurement point and the control device correspond to units which are connected in a daisy chain technique by means of the lines,
wherein the time delay Δt is calculated by the following equation $$\Delta t = \sum_{i=0}^{x} \frac{(RXBW_i - RXFW_i)}{2} - \frac{(TXBW_{i+1} - TXFW_{i+1})}{2},$$

where $RXBW_j$ corresponds to the time at which a specific data packet is received at the j-th unit in a backward direction,
where $RXFW_j$ corresponds to the time at which the specific data packet is received at the j-th unit in a forward direction,
where $TXBW_j$ corresponds to the time at which the specific data packet is sent to the j-th unit in the backward direction,
where $TXFW_j$ corresponds to the time at which the specific data packet is sent to the j-th unit in the forward direction,
where x corresponds to the number of the at least one further measurement point, and
where the control device corresponds to a 0-th unit and the measurement point corresponds to an 'x+1'-th unit.

3. A system for testing a power transmission network,
wherein the system comprises a control device and a plurality of measurement units,
wherein each measurement unit, which is connected to a respective measurement point in the power transmission network, is configured to detect an event at the respective measurement point and to transmit an item of information about the event to the control device,
wherein the control device is configured to detect a time at which the item of information about the event is detected by the control device,
wherein the system is configured to determine a time delay which is produced by the transmission of the item of information from the measurement unit, which detects the event, to the control device,
wherein the control device is configured to correct the time by the time delay and to test the power transmission network depending on the event and the corrected time,
wherein the item of information about the event is transmitted from the respective measurement point, via at least one further measurement point, to the control device,
wherein the respective measurement point, the at least one further measurement point and the control device are connected to one another via lines via which the item of information is transmitted, and
wherein determining the time delay comprises determining a run time of the lines and a processing time of the at least one measurement point in order to detect the item of information at the respective measurement point and to pass on said item of information.

4. The method according claim 1, further comprising the following steps:
detecting a first time at which a specific partial discharge pulse is detected in a power transmission cable of the power transmission network at a first measurement point which is arranged at one end of the power transmission cable,
detecting a second time at which the specific partial discharge pulse is detected in the power transmission cable of the power transmission network at a second measurement point which is arranged at the other end of the power transmission cable,
determining a fault location along the power transmission cable, at which fault location the specific partial discharge pulse was generated, depending on the first time and the second time,
determining a third and a fourth measurement point from a quantity of measurement points, which are arranged in the power transmission cable, in such a way that the third measurement point and the fourth measurement point delimit a section of the power transmission cable in which the fault location is situated and no further measurement points are located,
detecting a third time at which a further specific partial discharge pulse is detected in the power transmission cable at the third measurement point,
detecting a fourth time at which the further specific partial discharge pulse is detected at the fourth measurement point, and
correcting the determined fault location depending on the third time and the fourth time.

5. The method as claimed in claim 4, wherein the fault location is determined as a distance $l_f$ from the third measurement point using the following equation $$l_f = \frac{v_{PD}}{2}(t_3 - t_4) + \frac{l}{2},$$

where $t_3$ corresponds to the third time, $t_4$ corresponds to the fourth time, VPD corresponds to a propagation speed of the partial discharge pulse on the power transmission cable and l corresponds to a length of the section.

6. The method as claimed in claim 4, wherein the further specific partial discharge pulse corresponds to the specific partial discharge pulse, so that in each case the same partial discharge pulse is detected at the respective measurement point at the first, second, third and fourth times.

7. The method as claimed in claim 4, wherein the event comprises one of the specific partial discharge pulse and the further specific partial discharge pulse, the first time, the second time, the third time and the fourth time each correspond to a corresponding time at which the item of information about the corresponding partial discharge pulse is detected by the control device, and
wherein the method further comprises:
determining a respective time delay which is produced by a transmission of the respective item of information from the corresponding measurement point to the control device, and
correcting the respective time by the corresponding time delay.

8. The system according to claim 3, wherein
a first of the measurement units is connected to a first measurement point at one end of a power transmission cable in the power transmission network and a second of the measurement units is connected to a second measurement point at the other end of the power transmission cable in the power transmission network, the first and second measurement units are configured to detect a specific partial discharge pulse at that measurement point which is connected to the respective measurement unit in the power transmission cable, and the system is configured to detect a first time at which the specific partial discharge pulse is detected at the first measurement point by the first measurement unit by means of the first measurement unit, to detect a second time at which the specific partial discharge pulse is detected at the second measurement point by the second measurement unit by means of the second measurement unit, to determine a fault location along the power transmission cable, at which fault location the specific partial discharge pulse was produced, by means of the control device depending on the first time and the second time, to determine a third measurement point and a fourth measurement point, by means of the control device, in such a way that the third measurement point and the fourth measurement point delimit a section of the power transmission cable in which the fault location is situated and no further measurement point which can be connected to one of the measurement units is located, to detect a third time at which a further specific partial discharge pulse is detected at the third measurement point by the third measurement unit by means of a third of the measurement units which is connected to the third measurement point, to detect a fourth time at which the further specific partial discharge pulse is detected at the fourth measurement point by the fourth measurement unit by means of a fourth of the measurement units which is connected to the fourth measurement point, and to correct the determined fault location by means of the control device depending on the third time and the fourth time.

* * * * *

UNITED STATES PATENT AND TRADEMARK OFFICE
CERTIFICATE OF CORRECTION

| | | |
|---|---|---|
| PATENT NO. | : 11,287,461 B2 | Page 1 of 1 |
| APPLICATION NO. | : 16/616644 | |
| DATED | : March 29, 2022 | |
| INVENTOR(S) | : Harald Emanuel et al. | |

It is certified that error appears in the above-identified patent and that said Letters Patent is hereby corrected as shown below:

On the Title Page

In Item (30), under Foreign Application Priority Data, data reads "A 466/2017" but should read as --A50466/2017--.

Signed and Sealed this
Thirty-first Day of May, 2022

Katherine Kelly Vidal
*Director of the United States Patent and Trademark Office*